United States Patent [15] 3,700,918

Kawashima [45] Oct. 24, 1972

[54] LOGARITHMIC AMPLIFIER

[72] Inventor: Katsuhiko Kawashima, Amagasaki, Japan

[73] Assignee: Mitsubishi Denki Kabushiki Kaisha, Tokyo, Japan

[22] Filed: April 13, 1970

[21] Appl. No.: 27,820

[52] U.S. Cl. ..................307/230, 307/230, 307/311, 328/145

[51] Int. Cl. ..............................................G06g 7/12

[58] Field of Search ..328/145, 144, 3; 307/311, 230, 307/229; 235/194

[56] References Cited

UNITED STATES PATENTS

| | | |
|---|---|---|
| 3,197,627 | 7/1965 | Lewis.....................328/145 X |
| 3,248,654 | 4/1966 | Shiragaki.......................328/3 |

FOREIGN PATENTS OR APPLICATIONS

| | | |
|---|---|---|
| 1,110,354 | 2/1966 | Great Britain |

*Primary Examiner*—Donald D. Forrer
*Assistant Examiner*—B. P. Davis
*Attorney*—Robert E. Burns and Emmanuel J. Lobato

[57] ABSTRACT

A circuit including a semiconductor logarithmic transfer element is connected to an operational amplifier through a resistor having a resistance proportional to its absolute temperature. A comparison voltage dependent upon the transfer element is also applied to the amplifier through another resistor similar in temperature dependency to the first resistor to be substracted from the output from the circuit. The resulting difference is completely temperature compensated and indicated on an indicator having an indication span controlled by a variable resistor connected across the amplifier and a zero point adjusted by a bias to the amplifier.

4 Claims, 8 Drawing Figures

LOGARITHMIC AMPLIFIER

BACKGROUND OF THE INVENTION

This invention relates to a logarithmic amplifier using a transistor or a semiconductor diode as a logarithmic transfer element and compensated for a change in temperature.

Logarithmic amplifiers provide an output level proportional to the logarithm of input signal applied thereto. They have a wide variety of applications in the fields of nuclear instrumentation, and vacuum measurements, optical apparatus, analog computers etc.

In logarithmic amplifiers using a transistor, a semiconductor diode or the like as a logarithmic transfer element, the output depends upon the temperature thereof and can be generally provided as a linear function of the logarithm of the applied input signal as long as the temperature remains unchanged. Thus the logarithmic amplifiers are required to be compensated for a change in temperature or to be operated in the thermostat for all practical purposes. It has been commonly practiced to operate such amplifiers in temperature compensated state.

The conventional type of logarithmic amplifiers compensated for temperature are disclosed, for example, in British Pat. No. 1,110,354. According to the above patent, the deviation of the operational characteristic at a higher temperature $T_1$ from the corresponding characteristic at a lower temperature $T_2$ is corrected by a two step operation that the characteristic at $T_1$ is first translated to that at $T_2$ to intersect the latter and then a difference in slope between both the characteristics is corrected to cause the characteristic at $T_1$ to apparently coincide with that at $T_2$. This is because the magnitude of the parallel displacement or translation depends upon the magnitude of the input current. This measure, however, requires to adjust the temperature coefficient of the compensation by the parallel displacement in accordance with the level of the input current to the logarithmic amplifier for which the associated indicator is set to indicate zero and for each setting. Thus such a temperature compensation method is disadvantageous in that the resulting compensation by parallel displacement is proper only for the particular adjustment of indication and therefore that it is not of generality.

SUMMARY OF THE INVENTION

Accordingly it is an object of the invention to provide a new and improved logarithmic amplifier precisely compensated for a change in temperature on the theoretical basis and wherein the abovementioned disadvantages are eliminated.

It is another object of the invention to provide a new and improved logarithmic amplifier capable of being compensated for a change in temperature under a single set of compensation conditions regardless of the conditions for zero and indication-span adjustments as well as easily correcting the fluctuations of the degree of compensation due to a circuit element involved through the fine adjustment of a certain parameter intrinsically associated with that element.

The invention accomplishes these objects by the provision of a logarithmic amplifier with the good temperature compensation characteristic comprising a logarithmic transfer circuit including a semiconductor logarithmic transfer element, and an analog operational amplifier circuit operatively coupled to the logarithmic transfer circuit, characterized in that there is provided a voltage generator circuit for generating a predetermined voltage intrinsically associated with the logarithmic transfer element, operatively coupled to the analog operational amplifier circuit, and that the analog operational amplifier circuit provides a difference between the output from the logarithmic transfer circuit and the predetermined voltage from the voltage generator circuit multiplied by the gain thereof inversely proportional to an absolute temperature of the logarithmic amplifier.

BRIEF DESCRIPTION OF THE DRAWINGS

The invention will become readily apparent from the following detailed description taken in conjunction with the accompanying drawings in which.

DESCRIPTION OF THE PREFERRED EMBODIMENTS

Figure 1:
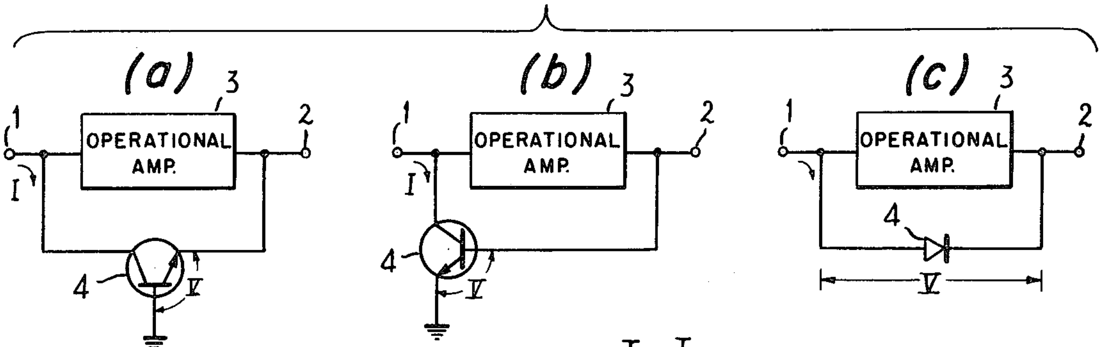
FIGS. 1*a*, *b* and *c* are schematic circuit diagrams of basic logarithmic transfer circuits commonly employed.

Referring now to FIG. 1, an input terminal 1 is connected to an output terminal 2 through an operational amplifier 3 having connected thereacross a logarithmic transfer element 4 shown in FIG. 1*a* as being an NPN type common base transistor, in FIG. 1*b* as being an NPN type common emitter transistor, or in FIG. 1*c* as being a semiconductor diode. In each case the element 4 serves as a feedback element and the output terminal 2 provides an output voltage proportional to a logarithm of an input current flowing into the input terminal 1.

For a semiconductor junction included in a transistor or a semiconductor diode the input current I can be approximately expressed by $$I = I_1[\exp(qV/kT) - 1] \qquad (1)$$

where $I_1$ = magnitude of saturation current flowing through the semiconductor junction $V$ = absolute magnitude of output voltage at the output terminal 2

$q$ = elementary charge $T$ = absolute temperature $k$ = Boltzman's constant

Assuming that V >> 0.1 volt, exp $(qV/kT)$ can be regarded as being very large as compared with one.

Therefore the equation (1) can be approximately transformed into the equation $$lnI = lnI_1 + qV/kT \quad (2)$$

From the equation (2) it is seen that, with the temperature maintained constant, the $V$ is expressed as a linear function of a logarithm of the $I$. The Equation (1) or (2) is only approximately valid and the actual relationship is illustrated in FIG. 2 wherein the axis of ordinates represents a logarithm of current I and the axis of abscissas represents a magnitude of voltage $V$ with the parameter being an absolute temperature.

Figure 2:
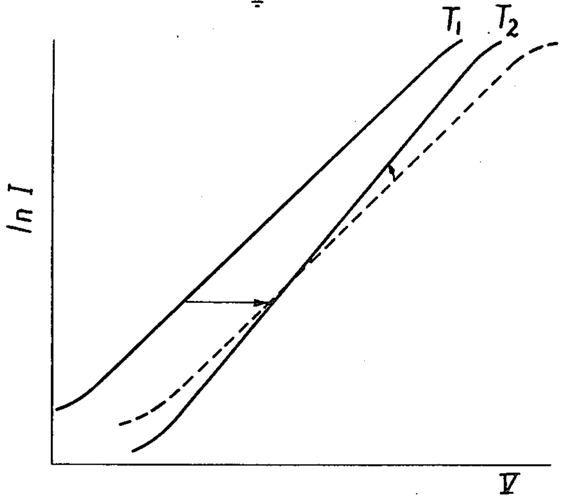
FIG. 2 is a graph representing the temperature dependency of the logarithmic transfer circuit such as shown in FIG. 1*a*, *b* or *c;*

From the Equation (2) and FIG. 2 it is apparent that the logarithmic transfer circuits such as shown in FIGS. 1*a*, *b* and *c* have the current-to-voltage characteristic dependent upon their temperature. For practical purposes, such circuits are required either to be temperature-compensated or to be operated in the thermostat. It has been commonly practiced to operate the circuits put in temperature compensated state.

Figure 3:
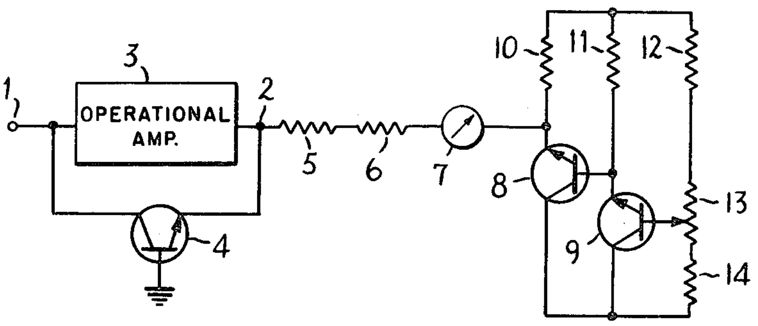
FIG. 3 (PRIOR ART)
FIGS. 3 and 4 are schematic circuit diagrams of logarithmic amplifiers temperature-compensated in accordance with the principles of the prior art.
Figure 4:
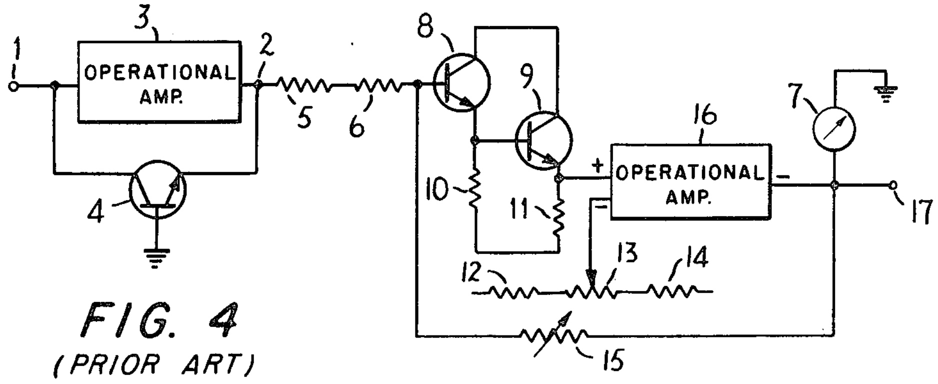
FIG. 4 (PRIOR ART)

Referring now to FIGS. 3 and 4 there are illustraTed two forms of logarithmic amplifier temperature compensated in accordance with the principles of the prior art. According to the principles of the prior art, a deviation of the $I$—$V$ characteristic at a higher temperature of $T_1$ from that at a lower temperature of $T_2$ has been corrected by firs effecting a parallel displacement or a translation of the characteristic at $T_1$ toward that at $T_2$ as shown at the arrow in FIG. 2 to bring in into a position shown at dotted line in the same Figure where both the characteristic curves intersect each other at a common point and then correcting a difference in slope between the $I$—$V$ characteristic at $T_2$ and the displaced one. That is, the displaced curve is rotated about the common point in the direction of the arrow shown in FIG. 2 until it approximately coincide with the curve at $T_2$. Thus a two stage compensation operation has been performed to cause the $I$—$V$ characteristic at $T_1$ to apparently coincide with that at $T_2$ (see British Pat. No. 1,110,354).

In FIG. 3, the logarithmic transfer circuit of FIG. 1*a* is connected at the output terminal 2 to a resistor 5 having a positive temperature coefficient of resistance and then connected to a series combination of a resistor 6 and an indicator 7 for indicating a logarithmic output. The resistor 6 and all resistors described hereinafter are low in temperature coefficient of resistance unless otherwise stated. The indicator 7 is then connected to an emitter electrode of an NPN type transistor 8. The emitter electrode of the transistor 8 is also connected to the emitter electrode of an NPN type transistor 9 through serially connected resistors 10 and 11 to form a two stage emitter follower. A series combination of resistor 12, potentiometer 13 and resistor 14 is connected across the junction of the resistors 10 and 11 and the junction of the collector electrodes of both transistors 8 and 9 while the base electrode of the transistor 9 is connected to a movable tap on the potentiometer 13.

The two-stage emitter follower as above described utilizes the temperature coefficient of voltage across the base and emitter electrodes of each transistor to effect the temperature compensation by the parallel displacement as above described. The resistor 5 having the positive temperature coefficient serves to correct a difference in slope between the $I$—$V$ characteristic as previously described. The resistors 12 and 14 and the potentiometer 13 are operative to adjust a zero point on the indicator 7.

In FIG. 4 wherein like reference numerals designate the components identical to those shown in FIG. 3, the resistor 6 is connected directly to the base electrode of transistor 8 forming a part of the two stage emitter follower similar to that shown in FIG. 3 along with the transistor 9 and the associated resistors 10 and 11. The transistor 9 includes its emitter electrode connected to one input to an operational amplifier 16 having the other input connected to the movable tap on the potentiometer 13. The output of the operational amplifier 16 is connected to the base electrode of the transistor 8 through a variable resistor 15 and also to one side of the indicator 7 connected on the other side to ground. The output of the amplifier 16 is further connected to an output terminal 17.

A circuit formed of the operational amplifier 16, the resistors 5, 6, 10, 12, 13, 14 and 15 and the transistors 8 and 9 serves to effect both the adjustment of indication span of the indicator 7 and the zero adjustment thereof. Particularly the variable resistor 15 serves to effect the indication span. The indication span adjustment and the zero adjustment are generally referred to hereinafter as the indication adjustment; the temperature compensation is accomplished in the same manner as above described in conjunction with FIG. 3.

From FIG. 2 it is apparent that the temperature compensation processes of the prior art type as above described have comprised the parallel displacement of the $I$—$V$ characteristic having its magnitude dependent upon the input current flowing into the input terminal 1. In other words, it has been required to adjust the temperature coefficient of the compensation by the parallel displacement in accordance with a level of an applied input current for which the indicator 7 is to be set to zero and for each setting. Therefore the arrangement as shown in FIGS. 3 and 4 are disadvantageous in that the temperature compensation due to the parallel displacement is effective only for the particular indication adjustment and is not of generality.

The invention contemplates not only to eliminate the disadvantages of the conventional processes as above described but also to provide new and improved means for precisely effecting the temperature compensation of logarithmic amplifiers on the theoretical bases but not relying on the parallel displacement and the slope adjustment separately effected as above described.

Before the invention will be minutely described the Equation (2) is considered. The saturation current $I_1$ appearing in the Equation (2) is a parameter dependent upon the geometry and material of that transistor or semiconductor diode including the p-n junction following the Equation (2). The current $I_1$ is theoretically known to be dependent upon the temperature of the junction as expressed by the theoretical equation $$I_1 = CT^d \exp(-(qV_o/kT) \quad (3)$$

where $C$, $d$, and $V_o$ are constants inherent to the transistor or diode, that is, the value $C$ is a constant dependent upon the geometrical construction of the semiconductor device, the value $d$ is a constant principally determined by the material thereof, and the value $V_o$ is an extrapolated energy gap at 0° K. By using the Napierian logarithm the Equation (3) becomes $$lnI_1 = -(qV_o/kI) + dlnT + lnC \quad (4)$$

If $T$ approximates an arbitrarily selected temperature $T_o$, wherein the value $T$ can be approximately expressed by the equation $$lnT = lnT_o - (T_o - T)/(T) \quad (5)$$

By substituting the Equation (5) into the Equation (4), the latter reduces to $$lnI_1 = -(q/lT)\, U_o + lnC(T_o)^d \quad (6)$$

where $$U_o = V_o + d(kT_o/q) \quad (7)$$

$e$ = base of Napierian logarithm.

The invention utilizes the quantity $U_o$ to effect the temperature compensation of logarithmic amplifier. The results of experiments conducted with a certain type of transistors indicated that a value of the quantity $U_o$ most suitable for the temperature compensation of logarithmic amplifier was equal to 1,264 volts coinciding with its theoretical optimum value. Experiments have been also conducted with the similar type of transistors, for example, NPN type silicon transistors to prove that the $U_o$ has been substantially constant.

By substituting the Equation (6) into the Equation (2), the latter reduces to:

$$lnI = (q/kT)\,(V - U_o) + lnC(eT_o) \quad (8)$$

If the common logarithm is used the Equation (8) becomes $$\log I = (q \log e)/(kT)\,(V - U_o) + \log C(eT_o)^d \quad (9)$$

Figure 5:
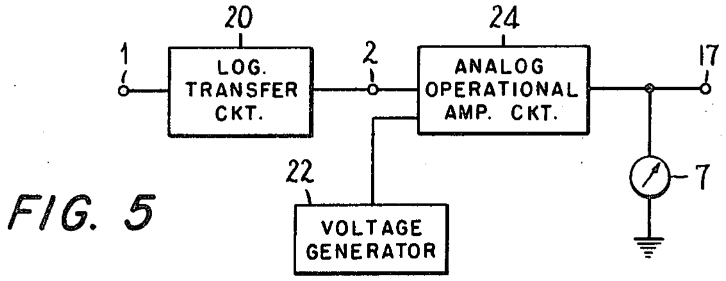
FIG. 5 is a block diagram of a logarithmic amplifier constructed in accordance with the principles of the invention.

Referring now to FIG. 5, there is illustrated in block form a logarithmic amplifier constructed in accordance with the principles of the invention. The arrangement illustrated comprises a logarithmic transfer circuit 20 such as previously described in conjunction with FIG. 1 including its input and output terminals 1 and 2 respectively, a voltage generator circuit 22 for generating a voltage $U$ associated with the quantity or voltage $U_o$ as above described, and an analog operational amplifier circuit 24 connected to the output of the logarithmic transfer circuit 20 and also to the output of the voltage generator circuit 22. As above described, the voltage $U_o$ depends upon the geometry and material of a logarithmic transfer element disposed in the circuit 20. The operational amplifier circuit 24 has a gain inversely proportional to its absolute temperature to serve to effect the temperature compensation and the indication adjustment of the output as will be described in detail hereinafter. The output of operational amplifier circuit 24 is connected to both an output terminal 17 and an indicator 17 connected to ground.

Figure 6:
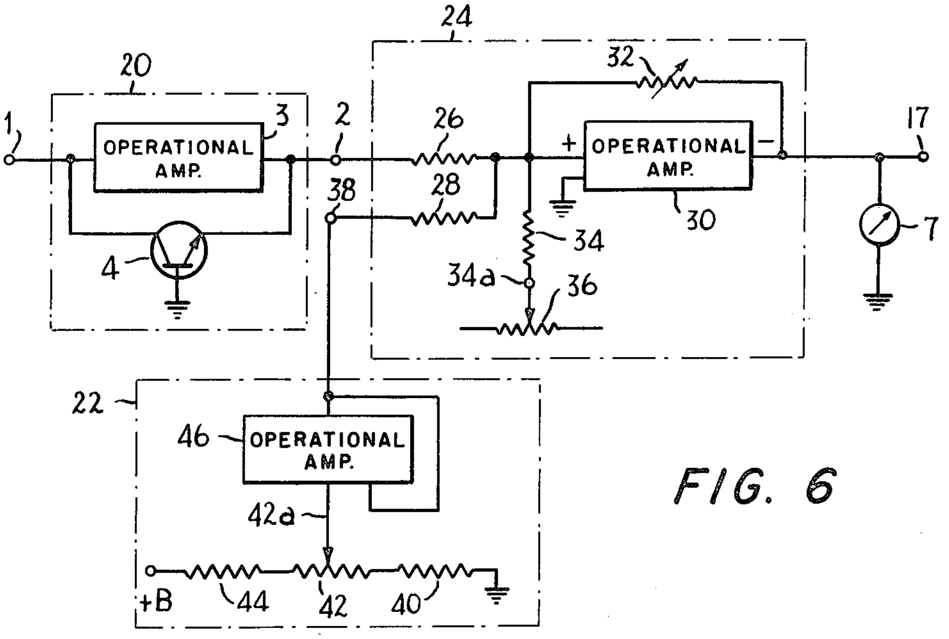
FIG. 6 is a schematic circuit diagram of the logarithmic amplifier shown in FIG. 5.

Referring now to FIG. 6 there is shown by way of example, the details of the arrangement shown in FIG. 5. The logarithmic transfer circuit 20 is identical in construction to the circuit of FIG. 1*a* and connected at the output 2 to an input resistor 26 forming a part of the analog operational amplifier circuit 24 including another input resistor 28. The input resistors 26 and 28 serves as temperature compensating resistors having the respective resistances dependent upon their absolute temperature. It is assumed that the resistors 26 and 28 have the respective resistances of $r_1(T)$ and $r_2(T)$ where $T$ represents an absolute temperature. The resistors 26 and 28 are connected together to one input to an operational amplifier 30 having the other input reversed in polarity from the one input and connected to ground. The operational amplifier 30 also serves as an inverter and includes its output connected to both the output terminal 17 and the indicator 7 and fed back to the one input thereto through a variable resistor 32 operative to set an output indication span within which the indicator 7 can indicate the output from the logarithmic amplifier 30. The junction of both resistors 26, 28 and the one input to the operational amplifier 30 is connected through a resistor 34 and a connection point 34*a* to a movable tap on a potentiometer or variable resistor 36 forming a part of a voltage divider connected across a source of voltage and ground although such a voltage divider is not illustrated in FIG. 6. The resistor 36 functions to set a level of an input current for which the indicator 7 provides a zero indication. The input resistor 28 is connected to the voltage generator circuit 22 at the output 38.

As shown in FIG. 6, the voltage generator circuit 22 comprises a resistor 40, a potentiometer 42 and a resistor 44 connected in series circuit relationship across ground and a source of constant voltage B+ to form a voltage divider. The potentiometer 42 includes a movable tap 42*a* connected to one input to an operational amplifier 46 including the other input connected directly to its output which is, in turn, connected to the output 38 of the voltage generator circuit 22. The operational amplifier 46 cooperates with the resistors 40, 42 and 43 to generate a predetermined voltage $U$ associated with the voltage $U_o$ dependent upon the geometry and material of the logarithmic transfer element of NPN type transistor 4 disposed in the logarithmic transfer circuit 20. The operational amplifier 46 has been provided for the reason that a fairly high current may flow from the voltage generator circuit 22 through its output 38 into the input resistor 28 of the operational amplifier circuit 24 leading to the necessity of rendering the output impedance of the circuit 22 sufficiently low. If desired, the operational amplifierm46 may be omitted with satisfactory results.

As an example, the operational amplifier 3 may be Model 301 Operational Amplifier manufactured by Keithley Co. in U.S.A. and the operational amplifiers 30 and 46 may be Model PF85AU Operational Amplifier and Model C-800 Amplifier manufactured by Phylbrick Nexus Co. in U.S.A. respectively.

Preferably the temperature compensating resistors 26 and 28 may be wire-wound resistors formed of a monovalent metal such as copper in the form of a wire and having magnitudes of resistance capable of being regarded as meeting respectively relationships $$r_1(T) = (T/273) r_1(273) \quad (10)$$

$$r_2(T) = (T/273)\, r_2(273) \quad (11)$$

where $r_1(T)$ = magnitude of resistance of resistor 26 at $T$ °K $r_2(T)$ = magnitude of resistance of the resistor 28 at $T$ °K $r_1(273)$ = magnitude of resistance of the resistor 26 at 273° K $r_2(273)$ = magnitude of resistance of the resistor at 273° K It is now assumed that the movable tap on the potentiometer 36 or the connection point 34a provides a voltage of $V_3$ and that the resistances of the resistors 32 and 34 have magnitudes of $r$ and $r_3$ respectively. Then an output voltage $V_{OUT}$ at the output terminal 17 is given by the equation $$V_{OUT}=\left(\frac{V}{r_1(T)}-\frac{U}{r_2(T)}\right)r-V_3\frac{r}{r_3} \quad (12)$$

If $U$ and $r_2(T)$ are selected to hold the relationship $$\frac{U}{r_2(T)}=\frac{U_0}{r_1(T)} \quad (13)$$

the voltage $V_{OUT}$ is expressed by the equation $$V_{OUT}=\frac{r}{r_1(T)}(V-U_0)-\frac{r}{r_3}V_3 \quad (14)$$

Substituting the equation (10) into the equation (14) yields $$V_{OUT}=\frac{273r}{r_1(273)}\cdot\frac{V-U_0}{T}-\frac{r}{r_3}V_3 \quad (15)$$

By eliminating $(V-U_o)/T$ from the Equation (15) and the Equation (9) for the characteristic of the logarithmic transfer circuit 20, the $V_{OUT}$ is expressed by the equation $$V_{OUT}=A\log I+B \quad (16)$$

where $$A=\frac{k}{q\log e}\times\frac{273r}{r_1(273)} \quad (17)$$

$$B=-A\log C(eT_0)^a-\frac{r}{r_3}V_3 \quad (18)$$

The Equation (16) describes that the logarithmic amplifier according to the principles of the invention provides the output voltage $V_{OUT}$ varying as a linear function of the logarithm of the input current I and quite independent upon the absolute temperature. In other words, the present logarithmic amplifier is completely compensated for a change in temperature.

Also from the Equations (16), (17) and (18) it will be apparent that the indication span for the output voltage can be adjusted by controlling the resistance $r$ of the resistor 32 while the zero adjustment of the indicator 7 can be effected by controlling the voltage $V_3$ at the movable tap on the potentiometer 36.

In FIG. 6, an input current $I$ having one polarity in this case the positive polarity flows into the input terminal 1 of the logarithmic transfer circuit 20 where it become in the form of a logarithm thereof in the well known manner. Then the output from the circuit 20 is applied through the output terminal 2 to the analog operational amplifier circuit 24 having applied thereto the predetermined voltage from the voltage generator 22. The operational amplifier circuit 24 is operated to subtract the predetermined voltage from the output from the circuit 20 as well as effecting the temperature compensation in the manner as above described. The resulting difference is indicated on the indicator 7.

Figure 7:
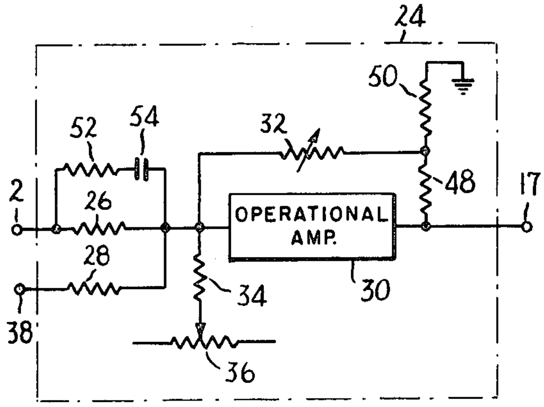
FIG. 7 is a fragmental schematic circuit diagram of a modification of the invention.

FIG. 7 wherein like reference numerals designate the components identical to those shown in FIG. 6 illustrates a modification of the analog operational amplifier circuit 24 shown in FIG. 6. The feedback resistor 32 is connected to the junction of resistors 48 and 50 forming a voltage devider connected across the output of the operational amplifier 30 and ground but not directly to that output. This measure permits a partial feedback while the abovementioned temperature compensation is still effected.

It will be readily understood that the resistor 26 formed of a wire-wound resistor has an inductance that may adversely affect the frequency characteristic of the logarithmic amplifier. To compensate for this deterioration of the frequency characteristic the resistor 26 may preferably have connected thereacross a series combination of resistor 52 and a capacitor 54.

In other respects the arrangement is identical to that shown in FIG. 6.

Figure 8:
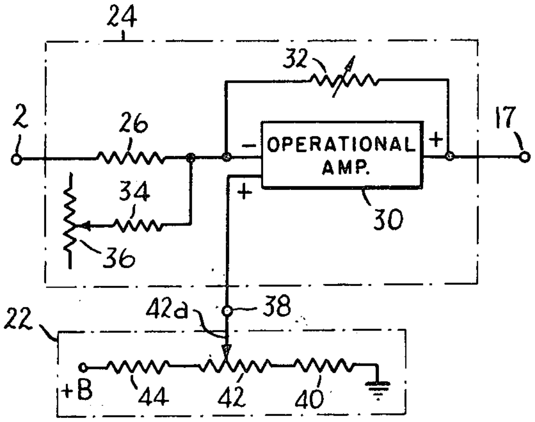
FIG. 8 is a fragmental schematic circuit diagram of another modification of the invention.

In the arrangements as shown in FIGS. 6 and 7, the operational amplifier 30 is arranged to have its input terminal labelled the plus (+) symbol kept at zero volt so that it is required to use a pair of input resistors formed, for example of wire-wound resistors in order to calculate the term "$(V-U_o)/T$." To remove this inconvenience, there may be used an arrangement as shown in FIG. 8 wherein like reference numerals designate the components identical to those illustrated in FIG. 6. The arrangement is different from that shown in FIG. 6 principally in that in FIG. 8 the resistor 28 and the operational amplifier 46 are omitted. More specifically, only the resistor 26 connected to the input terminal 2 of the logarithmic transfer circuit is connected to the negative input to the operational amplifier 30 serving also as an inverter and the movable tap 42a on the potentiometer 42 is directly connected to the other or positive input to the operational amplifier 30 through the output 38 of the voltage generator circuit 22. The other input is in phase with the output of the amplifier 30. In other respects the arrangement is identical to that shown in FIG. 6.

With an input current of $I$ flowing into the input terminal 1 as shown in FIG. 6, the output terminal 2 provides a logarithmic output voltage of $-V$ (which is negative in this case) holding the equation (9). Under these circumstances, it is assumed that the voltage generator circuit 22 for generating the voltage of $U$ has been preset to provide an output having a nagative value or $-U_o$. Then as will be readily understood from the Equation (14), the output terminal 17 will provide a voltage $V_{OUT}$ expressed by the equation $$V_{OUT}=r\frac{V-U_0}{r_1(T)}-V_o-\frac{r(V_3+U_0)}{r_3} \quad (19)$$

Substituting the Equation (10) into the above equation gives $$V_{OUT}=\frac{273r}{r_1(273)}\frac{V-U_0}{T}-U_0-\frac{r(V_3+U_0)}{r_3} \quad (20)$$

If $(V-U_o)/T$ is eliminated from both equations (9) and (20), there is obtained the following equation:

$$V_{OUT}=A\log I+B' \quad (21)$$

where A has the same meanings as in the Equation (17) and $$B'=-A\log C(eT_o)^a-(r/r_3)(V_3+U_o) \quad (22)$$

From the Equation (21) it is seen that the output voltage $V_{OUT}$ varies as a linear function of a logarithm of the input current $I$ while at the same time the voltage $V_{OUT}$ is independent of the absolute temperature. In other words, the arrangement of FIG. 8 is completely compensated for a change in temperature and in other respects is identical to that illustrated in FIG. 6. For example, the indication span of the indicator (not shown in FIG. 8) is controlled by adjusting the resistance $r$ of the resistor 32 while the zero adjustment thereof is accomplished by adjusting the voltage $V_3$ at the tap on the potentiometer 36.

It is recalled that the resistors 26 and 28 have temperature dependency as expressed by the Equation (10) and (11) respectively. It is to be noted that if a wire-wound resistor itself formed, for example of a copper wire-wound be used as either of the resistors 26 and 28 for the purpose of temperature compensation under the assumption that such a resistor follows approximately the Equation (10) or (11) that the satisfactory temperature compensation is impossible to be effected. The description will now be made in terms of a preferred method of manufacturing a resistor following the Equation (10) or (11) with an approximation sufficient to realize the logarithmic amplifier of the invention.

Copper wire was used to form wire wound resistors having their resistance of 100.00 ohms at 0° C. The resistances of the resistors were measured over a temperature range of from 0° C. to about 60° C. and the result thereof is typically listed in the following Table I. Also data for platinum wire for use in measuring temperatures quoted from Japanese Industrial Standard (JIS) C 1604 (1960) are listed in the following Table II.

Table I

| Meas Temperature | Meas Resistance in ohms | Difference in ohms |
|---|---|---|
| 0 °C | 100.00 | +0.1 |
| 1.7 | 100.71 | +0.1 |
| 8.3 | 103.46 | +0.09 |
| 19.0 | 107.67 | −0.16 |
| 20.6 | 108.33 | −0.17 |
| 29.7 | 112.25 | −0.05 |
| 39.8 | 116.41 | −0.10 |
| 50.4 | 120.89 | −0.06 |
| 62.5 | 126.10 | +0.10 |

Table II

| Temperature | Resistance in ohms | Difference in ohms |
|---|---|---|
| −10 °C | 96.02 | −0.03 |
| 0 | 100.00 | 0 |
| 10 | 103.97 | +0.02 |
| 20 | 107.93 | +0.04 |
| 30 | 111.87 | +0.03 |
| 40 | 115.81 | +0.03 |
| 50 | 119.73 | 0 |
| 60 | 123.64 | −0.04 |
| 70 | 127.54 | −0.08 |

The measured magnitudes of resistance $r_{Cu}$ listed in Table I can be approximately expressed by the linear equation $$r_{Cu}=0.4176T-14.18 \quad (23)$$

where $T$= absolute temperature. Also the magnitudes of resistance $r_{Pt}$ listed in Table II can be approximately expressed by the linear equation $$r_{Pt}=0.3946T-7.81 \quad (24)$$

where $T$= absolute temperature. In each of Tables I and II, the field labelled "Difference" shows a difference between the magnitude of resistance listed in that Table and the corresponding magnitude of resistance calculated by using the Equation (23) or (24). The plus signe means that the listed resistance is greater than the calculated resistance and the minus signe means that the listed resistance is smaller than the calculated one. Therefore it will be appreciated that over a temperature range of from 0° C. to about 60° C. within which the logarithmic amplifiers of the invention is to be operated, the wire wound resistor has a satisfactory rectilinearity with respect to the temperature so that a deviation of its resistance from the corresponding one given by the calculated linear equation does not exceed ±0.2 percent.

It has been found that with a copper wire wound resistor such as above described used as either of the resistors 26 and 28, the present logarithmic amplifier has a drift of output therefrom due to a change in temperature equal to approximately 0.3 decades over a temperature range of from 0° to 60° C.

From the Equation (23) it is seen that a composite resistor or a series combination of the wire wound resistor and a resistor having a resistance equal to about 14.2 percent of the resistance of the wire-wound resistor at 0° C. and low in temperature coefficient renders the constant term of the Equation (23) equal to zero. In other words, such a series combination of resistors will have a resistance approximately directly proportional to its absolute temperature. It has been found that the serially connected resistors as above described has a rectilinearity of less than 0.2 percent relative to the temperature over a temperature range of from −20° to 60° C. so that they have the performance sufficient to be used in the invention. It has been also found that when the series combination of resistors as above described are used as either of the resistors 26 and 28 the drift of output due to a change in temperature decreases to 0.02 decade or less over the same temperature range or a range of from 0° to 60° C.

For the platinum resistor listed in Table II a resistor having a resistance equal to about 7.81 percent of the resistance of that resistor at 0° C. and low in temperature coefficient can be used to render the constant term of the Equation (24) null.

Upon effecting the temperature compensation according to the principles of the invention it is to be noted that the logarithmic transfer element 4 and the temperature compensating resistors 26 and 28 should be put in thermally intimate coupling relationship as will be readily understood from the foregoing description.

While the invention has been illustrated and described in conjunction with a few preferred embodiments thereof it is to be understood that numerous changes in the details of construction and the arrangement and combination of parts may be resorted to without departing from the spirit and scope of the invention. For example, while the logarithmic transfer circuit has been described as having an input current with the positive polarity flowing into its input terminal it is to be understood that an input current with the negative polarity may flow into the input terminal of the logarithmic transfer circuit by replacing the NPN type transistor 4 by a PNP type transistor while reversing the polarity of the voltage from the voltage generator circuit 22.

What is claimed is:

1. A logarithmic amplifier having an improved temperature compensation characteristic comprising, in combination, a logarithmic transfer circuit having an input for receiving an input signal voltage, having an output, and including a semiconductor logarithmic transfer element, a voltage generator circuit for generating a predetermined voltage at an output thereof, and an analog operational amplifier circuit having first and second inputs coupled respectively to said logarithmic transfer circuit and said voltage generator circuit outputs, said analog operational amplifier circuit including means for varying the gain of said analog circuit in a relation inversely proportional to the absolute temperature of said gain varying means, and including means for producing an output voltage equal to the difference between an output voltage from said logarithmic transfer circuit and said predetermined voltage from said voltage generator circuit, multiplied by said gain thereof.

2. A logarithmic amplifier as claimed in claim 1 wherein said gain varying means includes a resistor having a resistance value which varies in proportion to its absolute temperature.

3. A logarithmic amplifier as claimed in claim 1 wherein said gain varying means comprises a composite resistor including a wire-wound resistor having resistance which varies in proportion to its absolute temperature, and a second resistor having a low temperature coefficient of resistance.

4. A logarithmic amplifier having an improved temperature compensation characteristic comprising, in combination, logarithmic transfer circuit means including a semiconductor logarithmic transfer element and having an input for receiving a direct current input signal, and an output for producing a signal which is a function of the logarithm of the received signal; voltage generator circuit means having an output for generating a predetermined voltage $U_o$ dependent upon the geometry and material of said semi-conductor logarithmic transfer element and expressed by the equation $$U_o = V_o + d(kT_o/q,$$

where $V_o$ is an extrapolated energy gap when the semiconductor logarithmic transfer element is at O°K, $d$ is a constant determined by the material of the semiconductor logarithmic transfer element, $k$ is Boltzmann's constant, $T_o$ is a fixed temperature in °K selected from a temperature range over which the logarithmic amplifier is to be operated, and $q$ is the elementary charge of said element; and an analog operational amplifier circuit having a gain inversely proportional to the absolute temperature thereof and including a pair of inputs connected respectively to said logarithmic transfer circuit means output and said voltage generator circuit means output, said analog operational amplifier including means for producing an output voltage equal to the difference between the output signal from said logarithmic transfer circuit means and said predetermined voltage from said voltage generator circuit means multiplied by said gain.

* * * * *